United States Patent [19]

Rowe

[11] 4,340,657

[45] * Jul. 20, 1982

[54] NOVEL RADIATION-SENSITIVE ARTICLES

[75] Inventor: William Rowe, Westfield, N.J.

[73] Assignee: Polychrome Corporation, Yonkers, N.Y.

[*] Notice: The portion of the term of this patent subsequent to May 26, 1998, has been disclaimed.

[21] Appl. No.: 241,803

[22] Filed: Mar. 9, 1981

Related U.S. Application Data

[63] Continuation-in-part of Ser. No. 122,347, Feb. 19, 1980, Pat. No. 4,269,689, which is a continuation-in-part of Ser. No. 2,647, Jan. 11, 1979, Pat. No. 4,214,965, which is a continuation of Ser. No. 600,653, Jul. 21, 1975, abandoned, which is a continuation of Ser. No. 328,678, Feb. 1, 1973, abandoned.

[51] Int. Cl.$^3$ .......................... G03C 1/78; G03C 1/96
[52] U.S. Cl. .......................... 430/56; 430/54; 430/253; 430/271; 430/284; 430/273; 430/502; 430/533; 530/536; 204/159.15; 204/159.17; 204/159.19
[58] Field of Search ................. 430/54, 56, 253, 271, 430/284, 273, 523, 533, 536, 502; 204/159.15, 159.17, 159.19

[56] References Cited

U.S. PATENT DOCUMENTS 3,257,203 6/1966 Süs et al. ........................... 430/77
3,615,450 10/1971 Werber et al. ..................... 430/306
4,269,680 5/1981 Rowe ............................ 204/159.17

*Primary Examiner*—Jack P. Brammer

[57] ABSTRACT

Photopolymerizable compositions comprised of (I) novel polymers which are substantially comprised of the reaction products of (A) organic polyisocyanates and (B) organic compounds containing at least about two active hydrogen atoms per molecule, said polymers having been end-capped by reaction with (C) organic compounds containing exactly one active hydrogen atoms and said end-capped polymers having viscosities of from about 5 to about 70 stokes when measured as a 30% solution in a mixture of approximately equal parts of xylol, methyl ethyl ketone and ethylene glycol monomethyl ether, at 25° C., (II) addition polymerization initiators activatable by actinic light, (III) addition polymerizable ethylenically unsaturated components capable of forming polymers by photoinitiated polymerization in the presence of the initiators, and (IV) a natural or synthetic rubber. The unsaturated components may be integral parts of the polymer's structure, or they may be separate compounds admixed with the polymers and initiators. Relief images, especially useful for printing, are prepared by exposure of a mass of the composition to a light source through, e.g., a transparency which has relatively opaque and relatively translucent areas, and subsequent development of the image by application of a developer composition.

7 Claims, No Drawings

NOVEL RADIATION-SENSITIVE ARTICLES

CROSS REFERENCE TO RELATED APPLICATIONS

This application is a continuation-in-part of U.S. patent application No. 122,347, filed Feb. 19, 1980 now U.S. Pat. No. 4,269,689, which is a continuation-in-part of U.S. patent application Ser. No. 2,647, filed Jan. 11, 1979 now U.S. Pat. No. 4,214,965, which was a continuation of U.S. application Ser. No. 600,653, filed July 21, 1975, now abandoned, which was a continuation of U.S. patent application Ser. No. 328,678, filed Feb. 1, 1973, now abandoned.

This invention is concerned with novel polymers, particularly polyurethanes, polyureas and polyurethanepolyureas and processes for their preparation. It is also concerned with the use of such polymers in certain formulations to obtain compositions which are sensitive to actinic light, thereby becoming crosslinked so that any areas of the material which have been exposed to actinic light become preferentially insoluble in solvents in comparison to areas which have not been exposed to actinic light. This characteristic of the material may be utilized to prepare relief images. These relief images are suitable for direct use in printing.

There are at present on the market several presensitized plates for relief images which may be exposed to actinic light and thereby initiate photopolymerization to harden the polymer in the exposed areas of the plate. When the exposed plate is then developed, or washed with a solvent system for the unexposed areas, those areas are preferentially dissolved or washed away, thereby leaving the light-exposed areas in relief. However, these current commercial plates have several disadvantages.

One plate marketed by du Pont under the trademark "Dycril" is oxygen-sensitive and must therefore be stored in an inert atmosphere, e.g., $CO_2$. If it is not stored in an inert atmosphere, the plate must be preconditioned for a substantial period of time in an inert atmosphere. The user of the plate has between 30 to 45 minutes within which a conditioned plate must be exposed. If a plate is not exposed within that time, it must be reconditioned. The conditioning of the plates in an inert atmosphere is required to remove oxygen absorbed on the surface of the material, which would otherwise interfere with photopolymerization. On aging, the unprotected surfaces of the plates exude a powder, which must be washed off before the plate can be used. If the user intends to retain exposed plates for use in the future, they must be stored under special conditions. If not, the plates are either not useful or of limited effectiveness. As can be imagined, there is added and undesirable cost involved in the need for the inert atmosphere, e.g., $CO_2$, and the conditioning and storage equipment.

The "Dycril" plates are believed to be made by a hot melt application of the light-sensitive composition to the support. Heating of the composition, whether during preparation of the plate or during exposure to a light source which emits heat in addition to light, will result in thermally induced polymerization. Thermal stabilizers are therefore required in the composition to prevent its deterioration. The composition is believed to be a mixture of triethylene glycol diacrylate (monomer), cellulose acetate hydrogen succiate (polymer), 2-ethylanthraquinone (photoinitiator) and p-methoxyphenol (polymerization inhibitor [stabilizer]). The photopolymerized composition is extremely hard and inflexible and only lends itself to use as a letter press plate. On aging at room temperature, the exposed plate becomes brittle and loses adhesion to the substrate.

Another plate is marketed by BASF under the trademark "Nyloprint" and is composed of a nylon composition on a metal support plate. The nylon composition is believed to be applied to the support as a hot melt. The disadvantages of the hot-melt is that the high glass transition temperature requires high melt temperatures for coating, and to inhibit thermally induced polymerization in the composition it is necessary to incorporate a thermal stabilizer in it. A plastic film overlay on top of the nylon composition is required to protect the surface from atmospheric oxygen, which would otherwise impair its light sensitivity and to prevent surface exudation and surface crystallization of the crosslinking monomer, initiator or both. The film must be removed before the plate is used. However, once the protective plastic film overlay is removed, the plate has a limited storage life, e.g., overnight, during which it must be used, but after which it is useless due to exudation. Also, a plate should not be cut to smaller size until just before it is to be used because the area of the plate near the cut edge, after standing, will not yield a high quality image.

W. R. Grace markets a raised image platemaking system under the tradename "Letterflex," which seems to be described in U.S. Pat. No. 3,615,450. The system is unique in that it is not a presensitized plate ready for use, but rather employs a solid polymeric composition having a shelf life of six months. The composition is fluidized (in which state it has a pot life of several weeks) at elevated temperatures in a machine supplied by Grace, and applied to a polyester film or aluminum plate by the user, the printer. The user must coat the polyester film with hot composition and cut the coated film to size. Exposure of the plate utilizes actinic light, but must be by projection of the negative through an air gap, rather than by intimate contact. Otherwise the negative would adhere to the tacky, viscous polymeric composition. The exposed plate is then post-exposed through the back of the polyester film to improve the physical bond of the polymer to the polyester film. The coated aluminum plate cannot be exposed through its back, of course. The plate is then etched with solution, rinsed and dried. The dried plate is given a post exposure from above to reduce residual tack on the printing surface and to harden the plate to some degree. As can be imagined, time consuming and tedious operations are involved. Exposure by projection does not yield a relief image having "shoulders," i.e., a pyramidal base, which are necessary for strength of the printing surface, especially in the case of half-tone dots. In addition the use of mercapto compounds in the composition requires the use of odor-masking agents.

There has now been discovered a class of polyurethanes, polyureas and polyurethane-polyureas which do not suffer the disadvantages of commercial products when they are used to prepare relief image printing plates. This class of polymers is described in detail in my co-pending U.S. application Ser. No. 122,347 filed Feb. 19, 1980, now U.S. Pat. No. 4,269,689.

An important feature of the present invention with is rubbery component is that a flexographic high relief printing plate may be thusly produced by applying the composition to a suitable substrate. Such plates have a soft, resilient surface which cushions the impact of a printing press impression. Such a flexographic plate is especially important for printing on thin films such as cellophane and polyethylene. The lack of sharp edges on such a plate permits printing of such materials without cutting or otherwise damaging the film. Such a plate allows high quality printing on the film without smears or sliding.

When used to make films or coatings, or in inks, e.g., printing inks, the compositions of this invention may be pigmented with many organic or inorganic pigments, e.g., molybdate orange, titanium white, phthalocyanine blue, chrome yellow, and carbon black, as well as colored by conventional dyes, e.g., methylene blue. Stock which may be printed includes paper, clay-coated paper, board and metal. In addition, the compositions of the present invention are suitable for the treatment of textiles, both natural and synthetic, e.g., in textile printing inks or for specialized treatments of fabrics to produce water repellency, oil and stain resistance, crease resistance, etc. The type and amount of pigment and dye used should be such that the curability of the photopolymerizable compositions is not adversely affected.

The photopolymerizable compositions of this invention are also useful as adhesives.

The 100 percent solids photopolymerizable coating compositions may be produced by mixing the selected components thereof by conventional known methods. The blend can be heated, if desired, to facilitate mixing, or the components may be present during synthesis, i.e., solvent, monomers, etc.

Although reference has been made herein to 100 percent solids coating compositions, it is to be understood that the coating compositions can also contain solvents and can be used to coat articles. The coating is then cross-linked after evaporation of the volatile solvent.

A solvent may be used to blend the unsaturated monomer and any other components in the photopolymerizable compositions, and to coat them as an integral composition onto an appropriate substrate. A suitable solvent desirably should dissolve both the unsaturated component and the other components at least to an extent that a commercially practical coating solution is formed, a solution in which the unsaturated component and other components are compatibly retained in the proportions desired for the coating subsequently to be formed on the substrate from the solution.

Practical organic solvents, used alone or in combination with others, and which are thus presently preferred according to this invention, include methylene chloride, dimethyl formamide, dimethyl sulfoxide, butyl Carbitol, methyl Cellosolve, methyl Cellosolve acetate, ketones such as acetone, methyl ethyl ketone and cyclohexanone, ethers such as trioxane and dioxane, and heterocyclics such as tetrahydrofuran, pyridine and isophorone. Methyl Cellosolve and methyl ethyl ketone are particularly suitable solvents to use.

The amount of solvent may be varied to suit any desired utility. Amounts from about 10 to about 90% may be useful.

The coating compositions may be applied by conventional means, including spray, melt, curtain, dip, pad and roll-coating techniques and by use of an intensive mixer and extruder, and may, if desired, be dried under ambient or oven conditions to provide coating films on a substrate with or without an intermediate bonding component. The substrate can be any composition, e.g., wood, metal, paper, plastic, fiber, ceramic, concrete, plaster, glass, etc. When the coating material is adhered to a rubber or fabric substrate known as an "offset blanket" one may effectively convert an offset printing press to a flexographic printing press by a simple substitution of printing press cylinders.

Coating thickness depends mainly on the concentration of the coating composition and the mechanical means by which it is applied to base sheets. For example, in a continuous process wherein a roll of sheet aluminum is passed through a coating tank, there must be taken into account for each particular system the speed of the web, the tank length, subsequent drying time and temperature, and solvent volatility, if any is used. The concentration of the coating composition can vary. Presently from about 10 to about 90 parts of photopolymerizable composition per 100 parts of coating composition can be used, good results being obtainable at concentrations of about 10 to about 50 parts thereof.

The photopolymerizable compositions of this invention when irradiated under a suitable actinic light source are converted to a cross-linked insoluble matrix. This insolubility may be useful for a variety of purposes. For example, if certain areas of a coating are cured and certain are not, as, for example, when the coating is exposed through a negative transparency, the coating may then be treated with a solvent or developer whereby the exposed areas are not dissolved and removed, but the unexposed areas are. Depending on the configuration and any substrate, such as metals and plastics, fabric, paper, etc. there can be formed, for example, storage-stable presensitized lithographic plates, printed circuit boards, presensitized silk screens, presensitized paper printing mats, UV-curable monofilaments and multifilament yarns, "rubber" stamps, stencils, flexographic printing plates, letterset printing plates, gravure printing plates, etc. The desired hardness or flexibility of the final cured form of the compositions can be achieved by formulation of the composition within the teachings of this invention.

An important aspect of this invention comprises photopolymerizable elements comprising an unsupported film or a support and a layer thereon, preferably solid, of the photopolymerizable compositions of this invention. The latter compositions can be readily converted into unsupported film or supported layer form in preparing the photopolymerizable elements, preferably from solution, utilizing conventional mechanical means and methods, e.g., coating, casting, extruding, calendering, or the like, with or without added plasticizers, fillers, etc. The photopolymerizable compositions in film or layer form are surprising in the excellent solid state properties they exhibit, even when containing relatively large proportions of the polymerizable component. Thus, these compositions, even when containing 50–60% by weight of the polymerizable component, still retain their desirable solid properties and most importantly show no appreciable increase in softness or tackiness. After exposure through a process transparency, these new compositions are readily developable to printing reliefs with suitable solvents.

The printing reliefs obtained from these compositions are outstanding because of the excellent wear resistance which they exhibit. Quite surprisingly, these printing reliefs, although prepared from a rubbery or elastomeric product, can be made rigid in the relief heights and print with excellent fidelity and substantially perfect register. The wear characteristics of the resulting plates are excellent and they form economical substitutes for the previously known premium quality plates, e.g., the difficult to prepare and expensive nickel-faced electrotypes. The printing plates are important commercially because of the extremely long press runs which can be carried out with them.

The photopolymerizable elements of the invention suitable for the preparation of relief images, especially useful for printing, comprise a film or a layer of the photopolymerizable composition from about 3 to about 250 mils in thickness and embody a suitable adherent support. In a preferred embodiment, these elements will comprise supports from which no more than 35% of the incident actinic light is reflected. When the support material is light reflective, e.g., metal plates or foils, which are outstanding because of inherent superior physical properties, there will preferably be superposed on said support and adherent thereto a layer absorptive of actinic light so as to permit reflectance from the combined support of no more than 35% of the incident actinic light. Thus, the support can contain an antihalation material or have a layer or stratum of such material on its surface. The photopolymerizable layer itself can serve as the light-absorptive layer when dyes or pigments or other materials significantly absorptive of the actinic light are included in the photopolymerizable composition. Similarly, the adherent support for the relief height-forming photopolymerizable stratum can be a supporting sheet of the photopolymerizable composition itself.

The printing reliefs may be such that an exposed and developed relief prints from the heights of the relief as in a letterpress or letterset plate, in which case the photopolymerizable element would be exposed to a negative transparency, or it may print from the low points of the relief as in a gravure plate, in which case the photopolymerizable element would be exposed to a positive transparency.

Although the photopolymerizable compositions bond well to clean substrates, chemical coupling agents may be used, if desired, to increase the bond of the composition to a substrate. Illustrative of such coupling agents is γ-aminopropyl triethoxysilane. Adhesives may be used to aid in bonding the composition to a substrate.

A type of photopolymerizable element which is particularly useful comprises a transparent support which has on one surface a coating of the photopolymerizable composition of this invention (the first layer) and which has coated on the other surface a second photopolymerizable composition (the second layer), the relative sensitivity of the said two layers being such that an imagewise exposure sufficient to provide a developable image in the second layer is insufficient to cause the formation of any appreciable developable image in the first layer. In practice the second layer is exposed to an original, the resultant image formed in the second layer is developed, stabilized or fixed. The first layer is exposed to an all-over ultraviolet light through said image and the resultant positive image of the original is developed in the first layer by removing the unexposed photopolymerizable composition in the first layer. As the transparent support any material relatively transparent to ultraviolet light may be used, but poly(ethyleneterephthalate) film is preferred. If necessary, the surface to which the first layer is attached may be treated to increase adhesion between the surface and first layer. The other surface is made receptive to said second layer through the usual means used in preparing photographic film, i.e., "subbing."

A preferred photopolymerizable element of the above type comprising such a second composition is one in which the other surface of the support is coated with a silver halide emulsion layer (the second layer). In practice the silver halide emulsion side is exposed to an original, the resultant silver halide image formed in the second layer is developed, stabilized, fixed and/or the exposed silver halide is removed. The first layer is exposed to an all-over ultraviolet light through the silver image and the resultant positive image of the original is developed in the first layer by removing the unexposed photopolymerizable composition in the first layer.

In a modification of the above element the second layer comprises a peel-apart construction as known in the art and described, e.g., in U.S. Pat. No. 4,205,989 issued June 3, 1980; Japanese patent No. 38-9663 (1963) and Canadian patent No. 986,773 issued Apr. 6, 1976. In practice, a photosensitive element comprising a transparent support onto one surface of which has been applied the photosensitive composition according to my co-pending application Ser. No. 122,347 and to the second surface of which is applied the peel-apart construction, is exposed through said construction to an original whereby upon peeling off the exposed areas of the peel-apart element a negative image of the original remains upon the support. The first layer is then exposed to an over-all UV light through said negative image and the resultant positive image developed in said first layer by removal of the unexposed photopolymerizable composition in the first layer.

In another modification of the above element the second layer comprises a photoconductive composition, such as is described in U.S. Pat. No. 3,257,203 wherein the photosensitive composition and support, as described above, replace the transparent support described therein. In practice, the element is exposed, after electrostatic charging, to an original through the second layer, coated and the latent image fixed. Thereafter the first layer is over-all exposed through the second layer and developed as described above to produce a printing plate.

In yet another preferred embodiment of the above element, the second layer comprises a negative working composition comprising a photohardenable component and a pigment. After exposing the second layer of UV radiation, through an original, and development, to remove the unexposed portion, the first layer is exposed by over-all illumination, through the developed second layer, and developed to yield a printing plate.

In still another embodiment of the above element, the second layer comprises a photoresist composition comprising an etchable layer in contact with the second surface of the first support said etchable layer being overcoated with a positive or negative acting photoresist composition (the etchable layers and photoresist compositions are known in the art). The photoresist composition is exposed, through an original, and the second layer treated with developer to remove the soluble portions of the photoresist and then with an etchant to remove those portions of the etchable layer no longer protected by the photoresist. After development and etching of said second layer the first layer is exposed to over-all illumination through said developed and etched second layer and developed to remove unexposed portions to produce a printing plate.

The methods and means of exposing and developing the first plate are those well known and commonly used in the art. The developer may be any solvent for the photopolymerizable composition which does not adversely affect the polymerized area.

The light-promoted reactions induced by initiators in the photopolymerizable compositions causes a sufficient differential between exposed and unexposed areas of the composition so that the developing solution effects removal of the unexposed area without adversely affecting the exposed area.

Actinic light from any source and of any type can be used in the photopolymierzation processes of this invention. The light can emanate from point sources or be in the form of parallel rays or divergent beams. Inasmuch as the free-radical generating, addition polymerization initiators activatable by actinic light generally exhibit their maximum sensitivity in the ultraviolet range, the light source should furnish an effective amount of this radiation. Such sources include carbon arcs, mercury-vapor lamps, fluorescent lamps with special ultra-violet light-emitting phosphors, argon glow lamps, and photographic flood lamps. Of these, the mercury-vapor lamps, particularly the sun lamp type, and the fluorescent sun lamps are most suitable.

Among the numerous improvements and advantages provided by this invention are, briefly, the provision of photosensitive compositions that (1) are generally more light-sensitive, i.e., faster, than many prior art photosensitive systems, (2) are not adversely affected by storage in air, (3) cure on a substrate to form a durable, abrasion resistant, solvent resistant finish, (4) may be developed on a substrate with relatively inexpensive desensitizing or developing solutions, (5) have substantially at least the shelf life, storability, light-sensitivity and durability of, e.g., currently commercial presensitized printing plates, and generally substantially longer presslife, (6) generally have excellent oleophilic properties, which is advantageous in attracting inks, (7) require no special storage after development, (8) can be satisfactorily developed to form high quality, sharp, fine objective areas or images quickly and easily by development with developers, (9) many of the cured formulations exhibit outstanding resistance to attack by chemicals, e.g., hydrofluoric acid, solvents, etc.

The following examples are illustrative of, and non-limiting to, the scope of the invention as defined by the claims.

EXAMPLE 1

A photocurable mixture prepared in accordance with Example 1 of co-pending application no. 122,347 was applied to the first surface of a sheet of poly(ethylene terephthalate), (PET). To the second surface of said sheet was applied a silver halide emulsion which was illuminated through a positive mask. After developing, the exposed areas of the emulsion became opaque whereas the non-exposed areas were transparent. The first layer was then exposed by over-all illumination through the second layer to actinic light between 200 and 420 nm for 3–15 minutes and then developed by removal of the non-exposed areas with a solvent, which does not attack or remove the exposed areas, to produce a positive acting printing plate.

EXAMPLE 2

Example 1 was repeated except that to the second surface of the PET sheet there was adhered one surface of an Al foil. To the other surface of said Al foil there was applied a light-sensitive mixture comprising 2.5 gm naphthoquinone-1,2-(diazide-2)-5-sulfonic acid, 2-chloroethyl ester and 2.5 gm Bakelite TM 2620 phenolic resin dissolved in 50 ml of a 1:1 v/v mixture of methyl Cellosolve TM acetate and methyl ethyl ketone (prepared in accordance with Example 1 of U.S. Pat. No. 3,711,285 (issued Jan. 16, 1973)) by whirl coating. The second layer of the resultant element was exposed to a carbon arc light for three minutes through a positive image transparency and then developed with a 5% metasilicate solution. After development, the Al foil in the exposed areas is removed by etching and the first layer exposed by over-all illumination through the second layer to actinic light between 200 and 420 nm for 3–15 minutes and then developed by removal of non-exposed areas with a solvent which does not attack or remove the exposed portions, to produce a negative acting printing plate.

What is claimed is:

1. A photosensitive article comprising a transparent support upon the first surface of which is applied a composition which is comprised of an admixture of,
   I. a polymer which is substantially comprised of the reaction product of:
      A. an organic, active hydrogen containing compound, which compound has an average active hydrogen functionality in the range of from 2.0 to about 2.2 with,
      B. an excess of an organic polyisocyanate so as to form an isocyanate terminated prepolymer, said prepolymer having been subsequently reacted with,
      C. an organic, active hydrogen containing compound, which compound has exactly one active hydrogen; said polymer having a molecular weight of from 5,000 to 50,000 with 0% free isocyanate groups; and,
   II. an addition polymerization initiator activatable by actinic light; and,
   III. an addition polymerizable ethylenically unsaturated component capable of forming a polymer by photo-initiated polymerization in the presence of said initiator; and,
   IV. a natural or synthetic rubber in the amount ratio of rubber to polymer of 90:10 to 10:90 parts by weight; and, to the second surface of which is applied a second photosensitive layer.

2. The article according to claim 1 wherein the support comprises poly(ethylene terephthalate).

3. The article according to claim 1 wherein the second layer comprises a silver halide emulsion.

4. The article according to claim 1 wherein the second layer comprises a photoresist construction comprising an etchable opaque layer whose first surface is adhered to the second surface of the transparent support and upon whose second surface there is adhered a photoresist composition.

5. The article according to claim 1 wherein the second layer comprises a peel-apart construction comprising a photosensitive layer adherent to the second surface of the support sheet whose adhesion to said surface is destroyed upon irradiation and whose second surface is coated with another layer, upon which is superimposed a cover sheet, whose adhesion to the said photosensitive layer is greater than its adhesion to the cover sheet.

6. The article according to claim 1 wherein the second layer comprises a composition comprising a photohardenable component and a pigment.

7. The article according to claim 1 wherein the second layer comprises an electrophotographic construction.

* * * * *